United States Patent
Birrer et al.

(10) Patent No.: US 12,275,619 B2
(45) Date of Patent: Apr. 15, 2025

(54) POSITION-DETERMINING SYSTEM AND METHOD FOR ASCERTAINING A CAR POSITION OF AN ELEVATOR CAR

(71) Applicant: Inventio AG, Hergiswil (CH)

(72) Inventors: Eric Birrer, Buchrain (CH); Frank Olivier Roussel, Lucerne (CH)

(73) Assignee: INVENTIO AG, Hergiswil (CH)

( * ) Notice: Subject to any disclaimer, the term of this patent is extended or adjusted under 35 U.S.C. 154(b) by 1182 days.

(21) Appl. No.: 15/733,729

(22) PCT Filed: Apr. 11, 2019

(86) PCT No.: PCT/EP2019/059175
§ 371 (c)(1),
(2) Date: Oct. 7, 2020

(87) PCT Pub. No.: WO2019/206644
PCT Pub. Date: Oct. 31, 2019

(65) Prior Publication Data
US 2021/0032077 A1 Feb. 4, 2021

(30) Foreign Application Priority Data
Apr. 24, 2018 (EP) .................... 18169048

(51) Int. Cl.
*B66B 3/02* (2006.01)
*B66B 1/34* (2006.01)
*H03M 5/12* (2006.01)

(52) U.S. Cl.
CPC .............. *B66B 3/02* (2013.01); *B66B 1/3492* (2013.01); *H03M 5/12* (2013.01)

(58) Field of Classification Search
CPC ........... B66B 3/02; B66B 1/3492; H03M 5/12
See application file for complete search history.

(56) References Cited

U.S. PATENT DOCUMENTS 3,963,098 A * 6/1976 Lewis ................... B66B 1/3492
                                                                    187/394
4,009,377 A * 2/1977 Elms .................... G05B 19/291
                                                                    702/158
(Continued)

FOREIGN PATENT DOCUMENTS

CN          1733584 A          2/2006
CN          1733585 A          2/2006
(Continued)

OTHER PUBLICATIONS

CN-107074485-B; Inoue et al., "Car Position Detecting Device", 2018. (Year: 2018).*

(Continued)

*Primary Examiner* — Kristina M Deherrera
*Assistant Examiner* — Tania Courson
(74) *Attorney, Agent, or Firm* — William J. Clemens; Shumaker, Loop & Kendrick, LLP

(57) ABSTRACT

A position-determining system and a method for ascertaining a car position of an elevator car use a code tape mounted next to the elevator car in parallel with a movement direction and that includes a code-mark pattern of individual code marks, a detection apparatus mounted on the elevator car that detects the code marks, and an evaluation unit that determines the car position on the basis of the detected code marks. Here, n successive code marks of the code-mark pattern form a position mark, the position marks are unambiguously arranged in an n-digit pseudorandom sequence of various position marks, the position marks form a single-track code-mark pattern, and a discrete car position is assigned to each position mark. A detection region of the detection apparatus has a detection length in the movement direction that is shorter than a position-mark length of a position mark in the movement direction.

15 Claims, 2 Drawing Sheets

(56) References Cited

U.S. PATENT DOCUMENTS

| | | | | |
|---|---|---|---|---|
| 5,023,434 | A | * | 6/1991 | Lanfer .................... B66C 13/46 340/685 |
| 5,135,081 | A | * | 8/1992 | Watt ...................... B66B 1/3492 187/394 |
| 5,798,490 | A | * | 8/1998 | Vairio ................... B66B 1/3492 187/394 |
| 6,612,403 | B2 | * | 9/2003 | Silberhorn ............ B66B 1/3492 187/394 |
| 6,874,244 | B2 | | 4/2005 | Birrer et al. |
| 7,117,981 | B2 | * | 10/2006 | Logan .................... D07B 1/148 73/158 |
| 7,540,357 | B2 | * | 6/2009 | Finn ...................... B66B 1/3492 187/394 |
| 7,562,747 | B2 | * | 7/2009 | Marchesi .............. B66B 1/3492 33/708 |
| 7,597,176 | B2 | * | 10/2009 | Zaharia ................. B66B 1/3492 73/1.79 |
| 8,857,572 | B2 | * | 10/2014 | Leutenegger ........... B66B 3/023 187/394 |
| 9,266,699 | B2 | * | 2/2016 | Ogava ................... B66B 1/3492 |
| 9,797,751 | B2 | * | 10/2017 | Dolsak ................. G01D 5/2492 |
| 10,329,119 | B2 | * | 6/2019 | Puranen ................ B66B 1/3492 |
| 10,526,169 | B2 | * | 1/2020 | Muller .................. B66B 5/0031 |
| 11,124,388 | B2 | * | 9/2021 | Birrer ................... B66B 1/3492 |
| 11,230,455 | B2 | * | 1/2022 | Michel .................. B66B 1/3407 |
| 11,345,568 | B2 | * | 5/2022 | Inoue ................... G01D 5/24457 |
| 11,365,088 | B2 | * | 6/2022 | Sonnenmoser ....... B66B 5/0093 |
| 11,548,759 | B2 | * | 1/2023 | Michel ................... G01D 5/142 |
| 11,708,244 | B2 | * | 7/2023 | Cambruzzi ........... B66B 19/002 29/407.05 |
| 11,905,140 | B2 | * | 2/2024 | Bizzozero ............... B66B 19/00 |
| 2002/0112926 | A1 | * | 8/2002 | Siberhorn ............. B66B 1/3492 187/394 |
| 2003/0070883 | A1 | * | 4/2003 | Foster ...................... B66B 1/46 187/394 |
| 2004/0174161 | A1 | * | 9/2004 | Tausch ................. G01D 5/2492 187/394 |
| 2004/0216320 | A1 | * | 11/2004 | Birrer ................... B66B 1/3492 33/708 |
| 2006/0032711 | A1 | * | 2/2006 | Marchesi .............. B66B 1/3492 187/394 |
| 2012/0118678 | A1 | * | 5/2012 | Meierhans ............ B66B 1/3492 187/394 |
| 2019/0382234 | A1 | * | 12/2019 | Murata .................. G01B 7/003 |
| 2020/0055695 | A1 | * | 2/2020 | Inoue ........................ B66B 3/02 |

FOREIGN PATENT DOCUMENTS

| | | |
|---|---|---|
| CN | 107285152 A | 10/2017 |
| EP | 1412274 B1 | 4/2004 |
| EP | 1602610 A1 | 7/2005 |
| EP | 1634841 A1 | 3/2006 |
| EP | 1637493 A1 | 3/2006 |
| EP | 2189410 A1 | 5/2010 |
| WO | 03011733 A1 | 2/2003 |
| WO | 2013182644 A1 | 12/2013 |

OTHER PUBLICATIONS

BR-9303533-A; Garcia, "Elevator Position Sensor", 1995. (Year: 1995).*

DE-4209629-A; Matsumoto et al., Absolute Position Encoder With Coding Element Having Absolute and Incremental Symbol Patterns in Parallel Has Detector With Sensors for Recording Two Symbol Patterns and Discriminates Relative Phase Position of Encoder and Detector, 1992. (Year: 1992).*

* cited by examiner

18 COUNTERWEIGHT
30 EVALUATION UNIT
32 DETECTION APPARATUS
33 REMOTE MONITORING CENTER
35 ELEVATOR CONTROLLER
36 POSITION-DETERMINING SYSTEM

POSITION-DETERMINING SYSTEM AND METHOD FOR ASCERTAINING A CAR POSITION OF AN ELEVATOR CAR

FIELD

The invention relates to a position-determining system for ascertaining a car position of an elevator car that can be moved in an elevator shaft and to a method for ascertaining a car position of an elevator car that can be moved in an elevator shaft.

BACKGROUND

EP 1412274 B1 describes a position-determining system and a method for ascertaining a car position of an elevator car that can be moved in an elevator shaft. The position-determining system has a code-mark pattern that is mounted next to the elevator car in parallel with a movement direction, n successive code marks of the code-mark pattern forming a position mark. The code marks form magnetic poles, meaning that the code-mark pattern is made up of a number of magnetic north poles and south poles. The position marks are unambiguously arranged in an n-digit pseudorandom sequence of various position marks, the position marks forming a single-track code-mark pattern. A discrete car position is assigned to each of the mentioned position marks via an assignment table.

The position-determining system has a detection apparatus which is arranged on the vehicle car and can detect a complete position mark all at once. For this purpose, the detection apparatus has a number of Hall sensors which contactlessly scan the code-mark pattern and thus detect the position mark. The number and the arrangement of the Hall sensors is selected such that a detection length of a detection region of the detection apparatus extends over at least one position-mark length of a position mark in the movement direction. It is thus possible to detect a complete position mark immediately after restarting the position-determining system.

The position-determining system also has an evaluation unit which determines a car position on the basis of the position mark detected by the detection apparatus. It is thus possible to determine the car position immediately after starting the position-determining system.

In order to allow particularly reliable determination of the car position of the elevator car, the determination of the car position is designed to be completely redundant in the position-determining system of EP 1412274 B1. This means that a large number of Hall sensors is necessary, in total 32 Hall sensors in one embodiment of EP 1412274 B1. As a result, certain material costs are necessary for the position-determining system of EP 1412274 B1 and the accommodation of the Hall sensors in the detection apparatus takes up a certain amount of space. This cost is justified in particular if the position-determining system constructed in this way is used as the only and therefore safety-relevant position-determining system.

EP 1634841 A1 and EP 1637493 A1 likewise describe position-determining systems for ascertaining a car position of an elevator car that can be moved in an elevator shaft, which systems can also fully detect position marks at one point in time.

SUMMARY

In contrast, it is in particular an object of the invention to propose a position-determining system and a method for ascertaining a car position of an elevator car, which system and method can be implemented in a particularly simple and therefore inexpensive manner.

According to a first aspect of the invention, a position-determining system according to the invention for ascertaining a car position of an elevator car that can be moved in an elevator shaft has a code tape that is mounted next to the elevator car in parallel with a movement direction and that comprises a code-mark pattern made up of individual code marks, a detection apparatus that is mounted on the elevator car and comprises at least one sensor for detecting code marks of the code-mark pattern on the code tape, and an evaluation unit for determining the car position on the basis of the code marks detected by the detection apparatus. Here, n successive code marks of the code-mark pattern form a position mark, the position marks are unambiguously arranged in an n-digit pseudorandom sequence of various position marks, the position marks form a single-track code-mark pattern, and a discrete car position is assigned to each position mark.

According to the invention, a detection region of the detection apparatus has a detection length in the movement direction which is shorter than a position-mark length of a position mark in the movement direction. The detection apparatus thus does not extend along a complete position mark in the movement direction. The detection apparatus can thus only detect part of a position mark at one time and therefore cannot detect a complete position mark all at once. The detection apparatus must therefore advantageously have only a few sensors. The detection apparatus can thus be produced very inexpensively and only takes up little space.

The detection length of the detection apparatus in the movement direction is to be understood here to be the spatial extent of a detection region in the movement direction, in which region the detection apparatus can detect the code marks. If the detection apparatus has a plurality of sensors, the detection region is delimited by the outermost sensors in each case in the movement direction. To simplify matters, it can be assumed that the detection apparatus can only detect the code marks precisely in the region of the spatial extent of the detection region in the movement direction.

The position-mark length of a position mark in the movement direction is obtained from the product of a code-mark length of a code mark and the number of code marks from which a position mark is assembled.

The evaluation device is provided in particular for assembling a detected position mark from successively detected code marks of the code-mark pattern when the detection apparatus is shifted with respect to the code tape in the movement direction. As soon as the evaluation device has assembled a complete position mark during the mentioned shift of the elevator car, said device can also determine the car position from the mentioned assignment table. The necessary shift of the elevator car depends on the position-mark length in the movement direction. For a code-mark length of 4 mm and a number of 5 code marks per position mark, the necessary shift can be, for example, a maximum of 20 mm. After a restart, i.e. in particular after a power supply has been switched on and thus without knowing the last car position before the power supply is switched off, the position-determining system can thus determine the car position only when the elevator car has been sufficiently shifted in the movement direction.

The travel direction, i.e. whether the elevator car is shifted upward or downward, can be determined from the phase relationship of signals from two mutually spaced sensors. The sensors in particular have a distance of half a code-mark length from one another. The procedure is analogous to the procedure for detecting the direction of rotation. The position-determining system is thus advantageously based on known and protected technology, and can also be produced inexpensively owing to the small number of sensors necessary and requires little space in the movement direction.

The applicant has recognized that there are fields of application for position-determining systems in which immediate determination of the car position after a restart is not absolutely necessary. This is the case in particular if the car position determined by the position-determining system is not used by an elevator controller to control the shift of the elevator car in an open-loop or closed-loop manner, but rather for monitoring purposes, for example to monitor stopping accuracy of the elevator car at the various stops or floors of the elevator installation. To monitor the stopping accuracy, the individual stops can be approached in a configuration phase and the associated car positions can be stored. In a monitoring phase, the current car position can then be compared with the stored car position when stopping at a stop. The results of the monitoring can be read out, for example, by a service technician on site or transmitted to a remote monitoring center. Providing an additional position-determining system to an already existing position-determining system in order to control the shift of the elevator car in an open-loop or closed-loop manner is in particular necessary or expedient if the elevator controller does not have an interface for outputting the car position.

A second aspect of the invention relates to an elevator installation having a position-determining system of this kind.

The elevator installation has in particular a second position-determining system, which supplies an elevator controller of the elevator installation with information about the position of the elevator car and is designed to be independent of the first position-determining system.

According to a third aspect of the invention, the above-mentioned object is achieved by a method for ascertaining a car position of an elevator car that can be moved in an elevator shaft, in which method a detection apparatus mounted on the elevator car detects code marks of a code tape that is mounted next to the elevator car in parallel with a movement direction and that comprises a code-mark pattern made up of individual code marks and an evaluation unit determines the car position on the basis of the code marks detected by the detection apparatus, n successive code marks of the code-mark pattern forming a position mark, the position marks being unambiguously arranged in an n-digit pseudorandom sequence of various position marks, the position marks forming a single-track code-mark pattern and a discrete car position being assigned to each position mark.

According to the invention, a detection region of the detection apparatus has a detection length in the movement direction which is shorter than a position-mark length of a position mark in the movement direction. The detection apparatus thus does not extend along a complete position mark in the movement direction. The detection apparatus can thus only detect part of a position mark at one time and therefore cannot detect a complete position mark all at once.

When the detection apparatus is shifted with respect to the code tape in the movement direction, the evaluation device assembles a detected position mark from successively detected code marks of the code-mark pattern.

The embodiments of the position-determining system described below also apply analogously to the method for ascertaining a car position of an elevator car that can be moved in an elevator shaft.

The individual code marks of the code tape can be formed, for example, by magnetic poles. It is also possible for the code marks to have different dielectric constants or to have a specific color or brightness, for example white and black. In addition, the position marks can be produced in other ways.

The detection apparatus has at least one sensor, in particular a plurality of sensors, for detecting the position marks. The type of sensor or sensors is matched to the design of the position marks; the sensors can be designed, for example, as Hall sensors, sensors that detect capacitive effects or optical sensors. The sensors detect the code marks in particular contactlessly.

The evaluation device has in particular a programmable microcontroller, which evaluates the information about the code marks that was detected by the detection apparatus, and a storage device.

The assignment of a position mark to a car position is made in particular via an assignment table stored in the evaluation unit. The assignment could also be made using a suitable algorithm. The accuracy or resolution of the car positions ascertained in this way depends mainly on the code-mark length of the code marks in the movement direction, it being possible for the encoding of the code tape also to play a role. The code-mark length can be, for example, between 4 and 20 mm, meaning that the accuracy or resolution is also between 4 and 20 mm. With Manchester encoding of the code tape as described below, the accuracy or resolution is twice the code-mark length.

In one embodiment of the invention, the detection length of the detection region of the detection apparatus in the movement direction is longer than one code-mark length, in particular longer than two code-mark lengths. The detection apparatus is thus designed and arranged such that it can detect two, in particular three, successive code marks of the code-mark pattern simultaneously. This makes particularly reliable determination of the car position possible.

The detection length of the detection region of the detection apparatus in the movement direction is in particular not longer than five, more particularly not longer than four and most particularly not longer than three, code-mark lengths.

In one embodiment of the invention, the detection apparatus has at least four, in particular six, sensors arranged one behind the other in the movement direction. This makes particularly precise determination of the car position possible.

The code marks form in particular magnetic poles and the detection apparatus has in particular Hall sensors. This makes the implementation of the position-determining system particularly inexpensive.

In one embodiment of the invention, the code-mark patterns are encoded in Manchester encoding. This ensures that after no more than two successive code marks, there is a change in the value of the code mark and thus also a pole change, which allows particularly precise determination of the car position.

The detection apparatus has in particular at least six, in particular precisely six, sensors, which are arranged at a distance from one another that is smaller than one code-mark length of a code mark, in particular at a distance from one another of half a code-mark length of a code mark in the movement direction. The detection apparatus can thus determine, from the signals from the sensors, the position of the transition between two different code marks relative to the detection apparatus. Said apparatus can thus perform an interpolation between two successive position marks and thus between two car positions stored in the mentioned assignment table. The mentioned distance relates in each case to the distance from sensor center to sensor center in the movement direction.

The detection apparatus can thus be designed analogously to an interpolation device described in EP 1412274 B1.

The code-mark pattern is in particular designed like the code-mark pattern of EP 1412274 B1.

Additional advantages, features and details of the invention can be found in the following description of embodiments and with reference to the drawings, in which identical or functionally identical elements are provided with identical reference signs.

DETAILED DESCRIPTION

Figure 1:
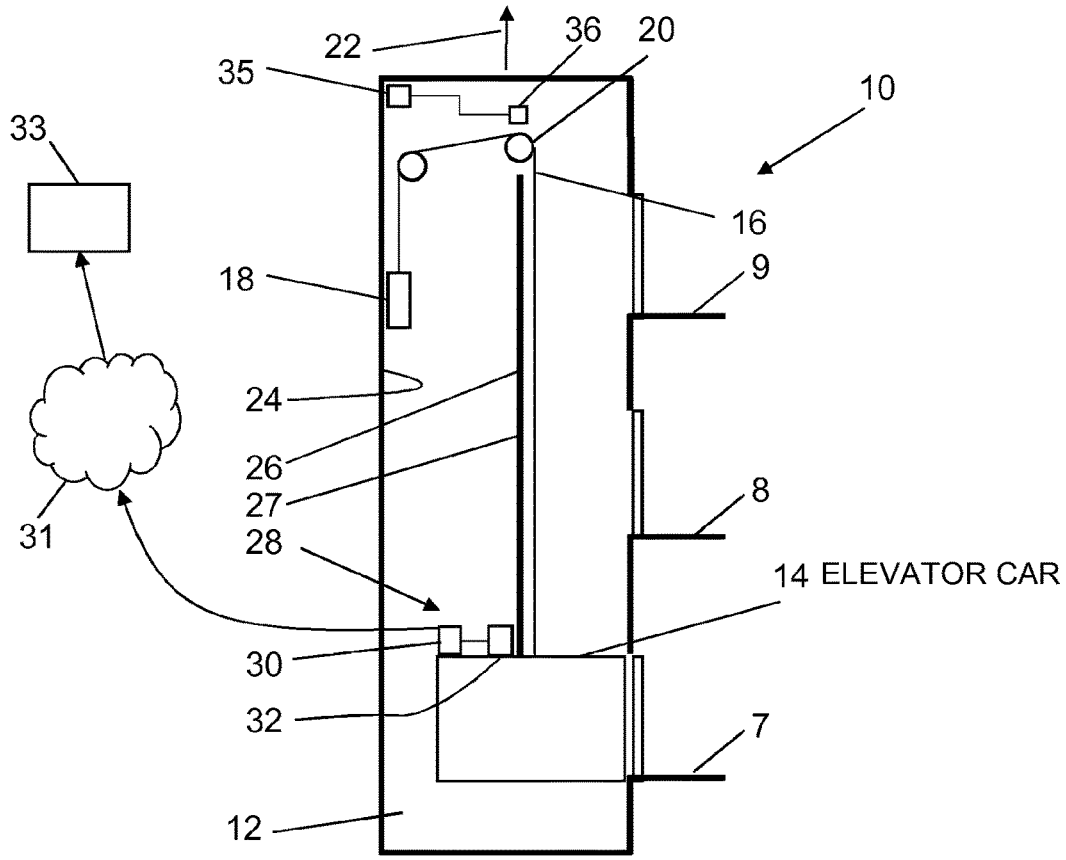
FIG. 1 is a schematic view of an elevator installation having a position-determining system according to the invention for ascertaining a car position of an elevator car that can be moved in an elevator shaft.

According to FIG. 1, an elevator installation 10 has an elevator shaft 12 oriented in the vertical direction. An elevator car 14 is arranged inside the elevator shaft 12 and is connected to a counterweight 18 in a known manner by means of a suspension means 16 in the form of a flexible belt or a cable. The suspension element 16 extends from the elevator car 14 over a drive pulley 20, which can be driven by a drive machine (not shown). The elevator car 14 can be moved up and down in the elevator shaft 12 by means of the drive machine and the suspension means 16. The elevator car 14 can thus be moved in the elevator shaft 12 in or against a movement direction 22, which extends upward in the vertical direction.

A guide rail 26, which extends in the movement direction 22, is secured to a shaft wall 24 of the elevator shaft 12. When the elevator car 14 is moved, it is guided along the guide rail 26 via guide shoes (not shown).

A code tape 27 in the form of a magnetic tape is arranged on the guide rail 26, which tape is shown in more detail in FIG. 2 and is described in more detail in connection with FIG. 2. The code tape 27 is used as a carrier for a single-track combined code-mark pattern, which represents the numerical code of absolute positions of the elevator car 14 in the shaft 12 in relation to a zero point. The code tape could also be arranged in the elevator shaft independently of a guide rail.

Parts of a position-determining system 28 for ascertaining a car position of the elevator car 14 are arranged on the elevator car 14. The position-determining system 28 has an evaluation unit 30 and a detection apparatus 32, which are arranged on the elevator car 14. The position-determining system 28 also comprises the code tape 27, is shown in more detail in FIG. 2 and is described in more detail in connection with FIG. 2.

The detection apparatus 32 is arranged on the elevator car in such a way that it can detect position marks formed by the code tape 27. As a result, the evaluation unit 30 and thus the position-determining system 28 can determine the car position of the elevator car 14.

In a configuration phase, the elevator car 14 is shifted in such a way that all floors 7, 8, 9 of the elevator installation 10 are approached. At each stop on one of the floors 7, 8, 9, the evaluation unit 30 stores the car position detected at that point in time together with a floor number of the floor 7, 8, 9. In a subsequent monitoring phase, the evaluation unit 30 compares, for each stop, the current car position with the car position stored for the corresponding floor 7, 8, 9. The evaluation device 30 sends the result of the mentioned comparison to a remote monitoring center 33 via a cloud 31. The monitoring center 33 monitors the transmitted results and triggers, for example, a corresponding message in the event of excessive deviations between car positions when stopping at a floor 7, 8, 9 and the associated stored car position. A service technician can, for example, check the elevator installation 10 on the basis of this message. In addition to the described procedure for monitoring the car position, there are many other monitoring options known to a person skilled in the art that can be used for monitoring the car position.

The described monitoring of the car position is independent of an elevator controller 35 which is arranged in the elevator shaft 12 and controls the entire elevator installation 10. For this purpose, the elevator controller 35 receives information about the position of the elevator car 14 from a second, additional position-determining system 36. The additional position-determining system 36 determines the position of the elevator car on the basis of detection of the speed of the drive pulley 20 and is therefore independent of the first position-determining system 28. The two position-determining systems 28 and 36 thus determine the position of the elevator car 14 independently of one another, and are not linked to one another or connected for signaling. The mentioned additional position-determining system 36, which supplies the elevator controller 35 with information about the position of the elevator car 14, can also be designed in another way which is considered useful to a person skilled in the art.

Figure 2:
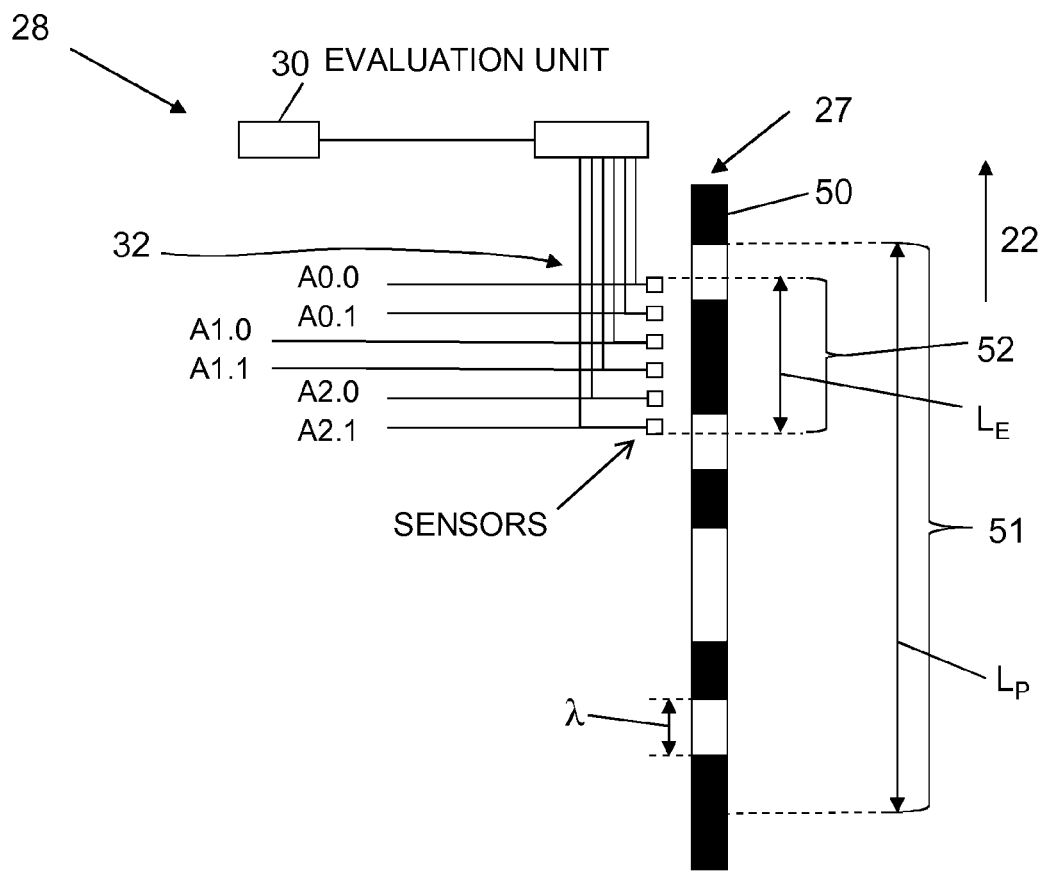
FIG. 2 is a schematic view of the position-determining system of FIG. 1.

FIG. 2 schematically shows the position-determining system 28 together with part of the code tape 27. The code tape 27 has a single-track combined code-mark pattern. The individual code marks 50 are symbolized by rectangular portions of equal length arranged in one track in the longitudinal direction of the code tape 27, each portion having a length of $\lambda=4$ mm, and magnetized either as a magnetic north pole (white rectangle) or as a magnetic south pole (black rectangle). The individual north poles and south poles form correspondingly oriented magnetic fields. A code mark is also referred to here as a bit. The encoding of the code tape 27 is made up of a pseudorandom binary sequence. A pseudorandom sequence consists of bit sequences having b binary digits arranged one behind the other without gaps. Each time an advance is made by one bit in the pseudorandom binary sequence, it is known that a new b-digit binary bit sequence appears. Such a sequence b of successive bits is referred to in the following as a code word.

The example of the code tape 27 shown in FIG. 2 is based on a pseudorandom sequence of code words having $b=4$ digits. The number of digits can also be significantly higher, for example $b=14$ or 16. In the movement direction 22 of the described pseudorandom sequence, a bit having a value of "1" is inserted after every bit having a value of "0" and a "0" bit is inserted after every "1" bit. A bit change therefore takes place after at most two bits in the single-track combined code-mark pattern. This type of encoding is known as Manchester encoding. This is shown on the code tape 27 in accordance with FIG. 2 in that only magnetic poles having a length of $\lambda=4$ mm and a double length of $2\lambda=8$ mm are present and in that there is a transition from a north pole to a south pole or vice versa at most after $2\lambda=8$ mm. Due to the described doubling of the bits, an unambiguous 5-digit reading pattern is read out without repetition of code words while simultaneously sampling in each case b+1=5 successive bits of the respective second bits of the combined code-mark pattern. Such a 5-digit reading pattern thus represents a position mark 51 arranged in the elevator shaft 12. The position mark 51 is thus assembled from a total of ten, i.e. n=10 successive code marks 50 and has a position-mark length $L_P$ of $10*\lambda=40$ mm.

The detection apparatus 32 for detecting the code marks 50 has a total of six Hall sensors A0.0, A0.1; A1.0, A1.1; A2.0; A2.1, which are arranged in the movement direction 22 on a line so as to have a distance from one another of half a code-mark length $\lambda/2=2$ mm. The distance relates in each case to the distance from sensor center to sensor center in the movement direction 22. The six sensors A0.0, A0.1; A1.0, A1.1; A2.0; A2.1 thus extend in the movement direction 22 over more than two and less than three code marks 50, as a result of which a total of three code marks 50 and thus less than ten code marks 50 of a complete position mark 51 can be detected by the detection apparatus 32. The outermost Hall sensors A0.0 and A2.1 in each case in the movement direction 22 thus delimit a detection region 52 of the detection apparatus 32 in the movement direction 22. The detection region 52 has a detection length $L_E$ in the movement direction. The detection length $L_E$ is a little longer than five times the distance of the Hall sensors A0.0, A0.1; A1.0, A1.1; A2.0; A2.1 from one another, i.e. slightly longer than $2.5*\lambda=10$ mm and thus significantly shorter than the position-mark length $L_P=40$ mm.

The six Hall sensors A0.0, A0.1; A1.0, A1.1; A2.0; A2.1 of the detection apparatus 32 form three sensor pairs (Ax.0, Ax.1). If one of the two sensors Ax.0, Ax.1 is in the vicinity of a magnetic pole change and supplies a sensor voltage of approximately the value of zero, then the other sensor Ax.0 or Ax.1 certainly covers one of the magnetic poles and supplies reliable information. All three first sensors Ax.0 are combined to form a first group and all three second sensors Ax.1 are combined to form a second sensor group. Of the sensors Ax.0 of the first sensor group and the sensors Ax.1 of the second sensor group, the sensors of the second sensor group being offset by half the code-mark length $\lambda/2=2$ mm in the movement direction 22, only the output signals from the sensors of one of the two sensor groups alternately are selected and evaluated for detecting the code marks 50 of the code tape 27.

In order to detect a complete position mark 51, the detection apparatus 32 and thus the elevator car 14 has to be shifted with respect to the code tape 27 in or against the movement direction 22. During the shift, the evaluation device 30 assembles the detected position mark 51 from the successively detected code marks 50. As soon as the evaluation device 30 has assembled a complete position mark 51, said device can determine the car position via a stored assignment table. In the example shown in FIG. 2, a shift of the elevator car 14 of approximately 40 mm is necessary for this purpose.

In order to determine a more precise car position, the evaluation device 30 additionally detects the quasi-equidistant pole transitions or zero crossings of the magnetic field between two successive north poles or south poles of the code-mark pattern on the code tape 27.

Figure 3:
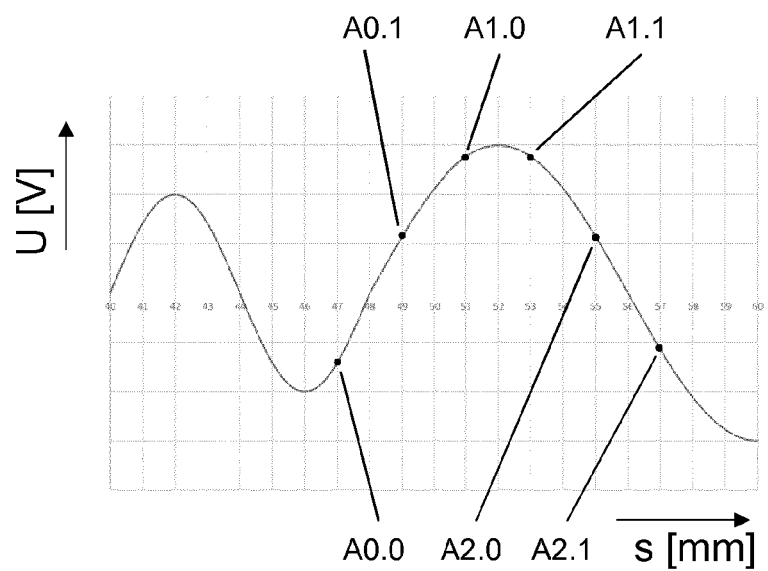
FIG. 3 shows sensor signals from sensors of a detection apparatus of the position-determining system.

FIG. 3 shows an example of the output voltages of the six sensors A0.0, A0.1; A1.0, A1.1; A2.0; A2.1 of the detection apparatus 32 along the path in the movement direction 22 in millimeter intervals. The voltages of the individual sensors A0.0, A0.1; A1.0, A1.1; A2.0; A2.1 are evaluated as follows, with the number representing the result of the mentioned query in each case (0=>false, 1=>true):

$U(A0.0) > 0 \Rightarrow 0$ $U(A0.0) + 1/3\ U(A0.1) > 0 \Rightarrow 0$ $U(A0.0) + U(A0.1) > 0 \Rightarrow 1$ $1/3\ U(A0.0) + U(A0.1) > 0 \Rightarrow 1$ $U(A0.1) > 0 \Rightarrow 1$ etc.

$U(A2.1) + 1/3\ U(A2.1) > 0 \Rightarrow 1$

For the example shown in FIG. 3, this results in the sequence of digits: 0011111111111111111. This means that a south pole extends to 0.5 mm behind the first Hall sensor A0.0. There is a north pole from 1.0 mm to 9 mm behind the first Hall sensor A0.0.

The sequence of digits generated is decoded into a three-digit binary sequence of numbers via a table stored in the evaluation unit 30, which sequence represents what is referred to as an interpolated car position of 3 mm in the example shown. This is periodic with the code-mark length $\lambda$ and indicates the polarity of the tape from the position of the first Hall sensor A0.0, calculated step by step in, for example, 0.5-mm steps. The most significant bit of this interpolated car position is inverted at a distance of 2 mm and is used for the described switch between the sensor groups of the detection apparatus 32. The interpolated car position ascertained in this way is added to the car position described above which was read out from the assignment table on the basis of the detected position mark 51. The result of this addition is the car position determined by the evaluation device 30, which position is used for the above-described monitoring of the stopping accuracy of the elevator car 14 on the floors 7, 8, 9.

Finally, it should be noted that terms such as "having," "comprising," etc. do not exclude any other elements or steps, and terms such as "an" or "a" do not exclude a plurality. Furthermore, it should be noted that features or steps that have been described with reference to one of the above embodiments can also be used in combination with other features or steps of other embodiments described above.

In accordance with the provisions of the patent statutes, the present invention has been described in what is considered to represent its preferred embodiment. However, it should be noted that the invention can be practiced otherwise than as specifically illustrated and described without departing from its spirit or scope.

The invention claimed is:

1. A position-determining system for ascertaining a car position of an elevator car movable in an elevator shaft, the system comprising:
   a code tape mounted next to the elevator car in parallel with a movement direction of the elevator car, the code tape including a code-mark pattern formed of a plurality of individual code marks each being a predetermined code-mark length in the movement direction;

a detection apparatus mounted on the elevator car for detecting the code marks of the code-mark pattern on the code tape;

an evaluation unit determining the car position of the elevator car in the elevator shaft based on the code marks detected by the detection apparatus;

wherein n successive ones of the code marks of the code-mark pattern form a position mark being a predetermined position-mark length in the movement direction, the code-mark pattern including a plurality of the position marks being unambiguously arranged in an n-digit pseudorandom sequence of various ones of the position marks, the position marks forming the code-mark pattern as a single-track code-mark pattern, and a discrete car position being assigned to each of the position marks; and wherein the detection apparatus has a detection region with a predetermined detection length in the movement direction that is shorter than the position-mark length of the position marks, the detection length being at least one code-mark length less than the position-mark length, and the detection length of the detection region in the movement direction being longer than the code-mark length.

2. The position-determining system according to claim 1 wherein the evaluation unit assembles a detected position mark from successively detected ones of the code marks of the code-mark pattern when the detection apparatus is shifted with respect to the code tape in the movement direction.

3. The position-determining system according to claim 1 wherein the detection length of the detection region of the detection apparatus in the movement direction is longer than two of the code-mark length.

4. The position-determining system according to claims 1 wherein the detection apparatus has at least four sensors arranged one behind the other in the movement direction for detecting the code marks.

5. The position-determining system according to claims 1 wherein the detection apparatus has six sensors arranged one behind the other in the movement direction for detecting the code marks.

6. The position-determining system according to claim 1 wherein the code marks form magnetic poles and the detection apparatus includes a plurality of Hall sensors for detecting the code marks.

7. An elevator installation comprising:
the elevator car movable in the elevator shaft; and
the position-determining system according to claim 1 adapted to ascertain the car position of the elevator car in the elevator shaft.

8. The elevator installation according to claim 7 wherein the position-determining system is a first position-determining system and including a second position-determining system supplying an elevator controller of the elevator installation with information about a position of the elevator car in the elevator shaft, the second position-determining system being independent of the first position-determining system.

9. The position-determining system according to claim 1 wherein the code-mark pattern is encoded in Manchester encoding.

10. The position-determining system according to claim 9 wherein the detection apparatus has six sensors, the sensors being positioned at a distance from one another that is smaller than the code-mark length.

11. The position-determining system according to claim 10 wherein the distance between adjacent ones of the sensors one half of the code-mark length.

12. A method for ascertaining a car position of an elevator car moveable in an elevator shaft, the method comprising the steps of:

detecting code marks using a detection apparatus mounted on the elevator car, the code marks being on a code tape that is mounted in the elevator shaft next to the elevator car in parallel with a movement direction of the elevator car, the code tape having a code-mark pattern made up of a plurality of individual ones of the code marks each being a predetermined code-mark length in the movement direction;

determining a position of the elevator car in the elevator shaft based on the code marks detected by the detection apparatus using an evaluation unit;

wherein n successive ones of the code marks of the code-mark pattern form a position mark being a predetermined position-mark length in the movement direction, the code-mark pattern including a plurality of the position marks being unambiguously arranged in an n-digit pseudorandom sequence of various ones of the position marks, the position marks forming the code-mark pattern as a single-track code-mark pattern, and a discrete car position being assigned to each of the position marks; and wherein the detection apparatus has a predetermined detection region in the movement direction that is shorter than the position-mark length of the position marks, the detection region being at least one code-mark length less than the position-mark length, and the detection length of the detection region in the movement direction being longer than the code-mark length.

13. The method according to claim 12 wherein the evaluation unit assembles a detected position mark from successively detected ones of the code marks of the code-mark pattern when the detection apparatus is shifted with respect to the code tape in the movement direction.

14. The method according to claim 12 wherein the detection apparatus detects code mark transitions using at least six sensors and the evaluation unit additionally determines the car position based on the detected code mark transitions.

15. An elevator installation comprising:
an elevator car movable in an elevator shaft;
a first position-determining system adapted to ascertain a car position of the elevator car in the elevator shaft, the first positioning-determining system including a code tape mounted next to the elevator car in parallel with a movement direction of the elevator car, the code tape including a code-mark pattern formed of a plurality of individual code marks each being a predetermined code-mark length in the movement direction, a detection apparatus mounted on the elevator car for detecting the code marks of the code-mark pattern on the code tape, and an evaluation unit determining the car position of the elevator car in the elevator shaft based on the code marks detected by the detection apparatus;

wherein n successive ones of the code marks of the code-mark pattern form a position mark being a predetermined position-mark length in the movement direction, the code-mark pattern including a plurality of the position marks being unambiguously arranged in an n-digit pseudorandom sequence of various ones of the position marks, the position marks forming the code-mark pattern as a single-track code-mark pattern, and a discrete car position being assigned to each of the position marks;

wherein the detection apparatus has a detection region with a predetermined detection length in the movement direction that is shorter than the position-mark length of the position marks, the detection region being at least one code-mark length less than the position-mark length; and a second position-determining system supplying an elevator controller of the elevator installation with information about a position of the elevator car in the elevator shaft, the second position-determining system being independent of the first position-determining system.

* * * * *